United States Patent

Tomasini et al.

[11] Patent Number: 5,815,037
[45] Date of Patent: Sep. 29, 1998

[54] HIGH-PASS FILTER, PARTICULARLY FOR CANCELING OUT THE OFFSET IN A CHAIN OF AMPLIFIERS

[75] Inventors: Luciano Tomasini, Monza; Rinaldo Castello, Arcore; Ivan Bietti, Casalromano; Giancarlo Clerici, Vimodrone, all of Italy

[73] Assignee: SGS-Thomson Microelectronics S.R.L., Agrate Brianza, Italy

[21] Appl. No.: 651,106

[22] Filed: May 21, 1996

[30] Foreign Application Priority Data

May 22, 1995 [EP] European Pat. Off. ............. 95830217

[51] Int. Cl.⁶ ...................................................... H03F 3/45
[52] U.S. Cl. ............................ 330/69; 330/260; 330/306
[58] Field of Search ................................ 330/69, 84, 126, 330/151, 260, 302, 303, 306; 327/559

[56] References Cited

U.S. PATENT DOCUMENTS

| | | | |
|---|---|---|---|
| 3,863,173 | 1/1975 | Scheib et al. | 330/306 X |
| 4,303,889 | 12/1981 | Yokoyama et al. | 330/151 X |
| 4,833,418 | 5/1989 | Quintus et al. | 330/9 |
| 4,871,976 | 10/1989 | Watanabe et al. | 330/84 X |
| 4,982,155 | 1/1991 | Ramsden | 324/207.2 |

FOREIGN PATENT DOCUMENTS

| | | | |
|---|---|---|---|
| 0 397 250 A2 | 11/1990 | European Pat. Off. | H03F 3/45 |
| 2 304 216 | 10/1976 | France | H03H 7/00 |
| 1528302 | 10/1978 | United Kingdom | 330/126 |

*Primary Examiner*—James B. Mullins
*Attorney, Agent, or Firm*—Seed and Berry LLP; David V. Carlson

[57] ABSTRACT

A high-pass filter includes at least one circuit unit constituted by a first branch and a second branch both connected to an input of the filter on one side and, on the other side, to an adder the output of which is the output of the filter. The first branch includes means for transferring an input signal substantially without modifying its frequency content, and the second branch comprises a low-pass filter. The circuit elements are chosen such that the components of the input signal with frequencies below the cut-off frequency of the low-pass filter are substantially cancelled out at the output of the adder. The filter is suitable for being produced within a particularly small area in an integrated circuit.

11 Claims, 4 Drawing Sheets

HIGH-PASS FILTER, PARTICULARLY FOR CANCELING OUT THE OFFSET IN A CHAIN OF AMPLIFIERS

TECHNICAL FIELD

The present invention relates to a high-pass filter particularly suitable for use for canceling out the offset in a chain of amplifiers.

BACKGROUND OF THE INVENTION

As is known, in order to produce an amplifier with a very high gain, several amplifiers are connected in cascade so that the overall gain is the product of the gains of the individual stages. It is also known that each stage has an "offset" (the voltage which has to be applied as an input in order to have a zero output voltage) which, although it can be reduced to very low values by suitable structural measures, can never be completely eliminated. A typical value of the offset for a differential operational amplifier with a voltage gain of 1, formed in a bipolar integrated circuit, is between 2 and 3 mV. In a chain of amplifiers of this type, coupled to one another directly, with an overall gain of 40 dB, the overall offset is thus between 200 and 300 mV.

In many applications, particularly those in which the dynamics of the signal to be amplified are low and the supply voltage of the amplifiers is also low, as in the case of telephone-band amplifiers, these offset values are not acceptable.

A typical method of eliminating or at least reducing the effect of the offset between two amplifier stages in cascade is that of connecting a high-pass filter, that is, a direct-current decoupler, between them. A known filter is shown, for example, in FIG. 1. The filter consists of a differential operational amplifier with feedback from each output by means of a capacitor and a resistor, Rf and Cf, in parallel, and of two capacitors Ci in series with the inputs. The transfer function of the filter, as voltage, is given by:

$$H(\omega) = \frac{Vo}{Vi} = \frac{Ci}{Cf} \cdot \frac{j\omega}{\frac{1}{RfCf} + j\omega}$$

in which Vo and Vi indicate the output and input voltages, respectively, and in which the capacitance and resistance values are indicated by the same symbols as are used to identify the corresponding components in the drawing.

This function has a single pole for:

$$\omega p = \frac{1}{RfCf}$$

and a single zero at a frequency of zero. The filter therefore allows all of the signals with frequencies above the cut-off frequency to pass and blocks any direct-current component present at its input. When this filter is connected between two amplifiers, it therefore completely cancels out the offset due to the stages upstream. The only remaining offset is that due to the filter itself and, typically, is between 2 and 3 mV.

The known filter described above can be used advantageously for canceling out the offset in a chain of amplifiers. When used in an integrated circuit, however, it takes up a fairly large area, mainly because of the capacitors which form part of it.

SUMMARY OF THE INVENTION

The main object of the present invention is to propose a high-pass filter which has functional characteristics similar to those of a known filter of the type described above but which can be used in an integrated circuit with less wastage of area.

This object is achieved by the provision of the high-pass filter characterized in general in claim I in which a high pass filter comprises at least one circuit unit constituted by a first branch and a second branch both connected to an input of the filter on one side and, on the other side, to an adder the output of which is the output of the filter, the first branch comprising means for transferring an input signal substantially without modifying its frequency content, and the second branch comprising a low-pass filter, the transfer means, the low-pass filter and the adder being of dimensions such that the components of the input signal with frequencies below the cut-off frequency of the low-pass filter are substantially cancelled out at the output of the adder.

The invention will be understood better from the following detailed description of an embodiment thereof given by way of non-limiting example with reference to the appended drawings.

Detailed Description of the Invention

Figure 2:
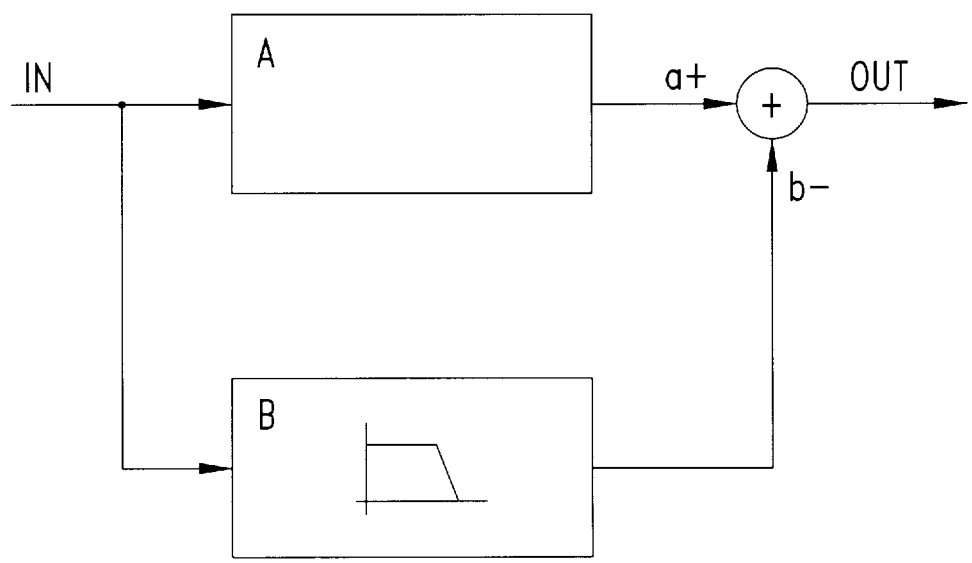
FIG. 2 is a block diagram of a high-pass filter according to the invention.

In FIG. 2, a high-pass filter 8 according to the invention is shown by a single circuit unit constituted by two branches, A and B, and by an adder 10. The branch A comprises circuit means for transferring an input signal substantially without modifying its frequency content and the branch B comprises a low-pass filter with a cutoff frequency fc. At one end, both of the two branches A, B are connected to the input IN of the filter and at the other end the two branches A, B are connected to two inputs, indicated a+ and b−, of the adder 10. The output OUT of the adder 10 is the output of the filter.

The frequency and gain characteristics of the transfer means of the branch A, of the low-pass filter of the branch B and of the adder 10 are selected such that the components of the input signal which have frequencies below the cut-off frequency fc of the low-pass filter are substantially cancelled out at the output of the adder. In the embodiment shown, this occurs because the signals at the inputs a+ and b− of the adder are substantially in phase with one another and have the same amplitude but have opposite signs. Therefore, signals with frequencies greater than the cut-off frequency fc pass through the filter unaltered, whilst those of lower frequencies cannot pass through because their algebraic sum is zero. In other words, a high-pass filter is formed by subtracting the output of the low-pass filter of branch B from the output of the branch A at the adder 10.

Figure 3:
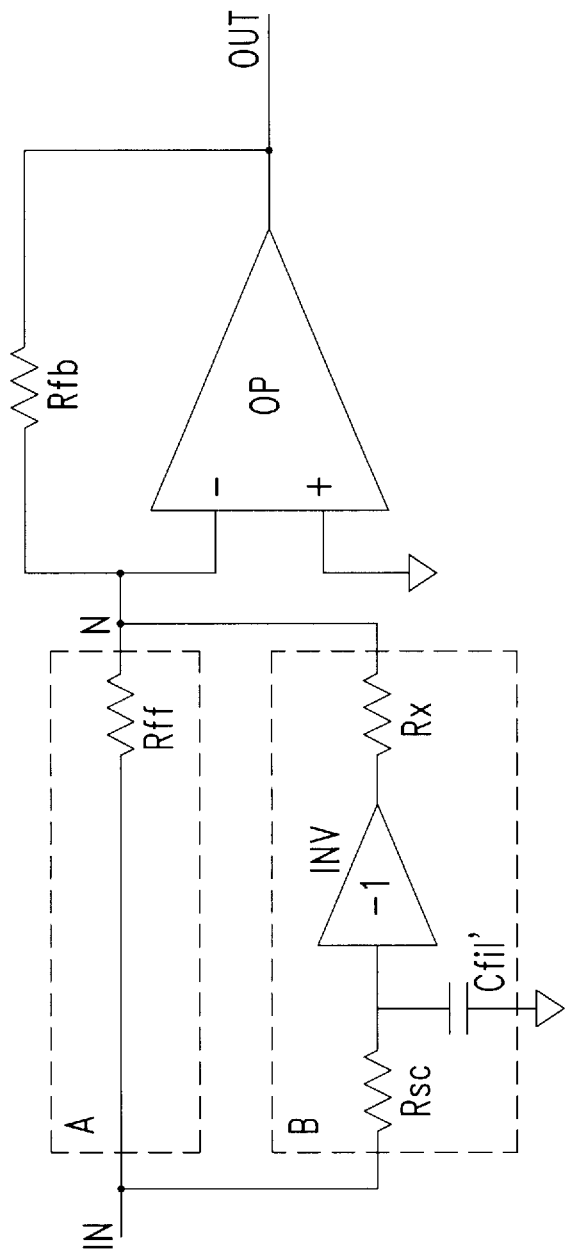
FIG. 3 is the circuit diagram of a single-ended version of a high-pass filter according to the invention.

FIG. 3 shows a practical circuit realization of the filter 8 of FIG. 2. The transfer means of branch A is constituted by a resistor Rff and the low-pass filter of branch B is constituted by a filter cell formed by a series resistor Rsc and by a capacitor $C_{fi}$ in a bypass towards the earth terminal, by an inverter INV connected to the connection point between the resistor Rsc and the capacitor $C_{fi}$, which is the output of the cell, and by a second resistor Rx in series with the output of the inverter INV. The adder 10 is constituted by an operational amplifier OP having its non-inverting input connected to a common reference terminal, in this case the earth terminal, and its inverting input connected to the circuit node N which connects the two resistors Rff and Rx. The two resistors Rff and Rx have substantially the same resistance and the operational amplifier OP is provided with feedback by means of a resistor Rfb between its output and its inverting input.

Figure 4:
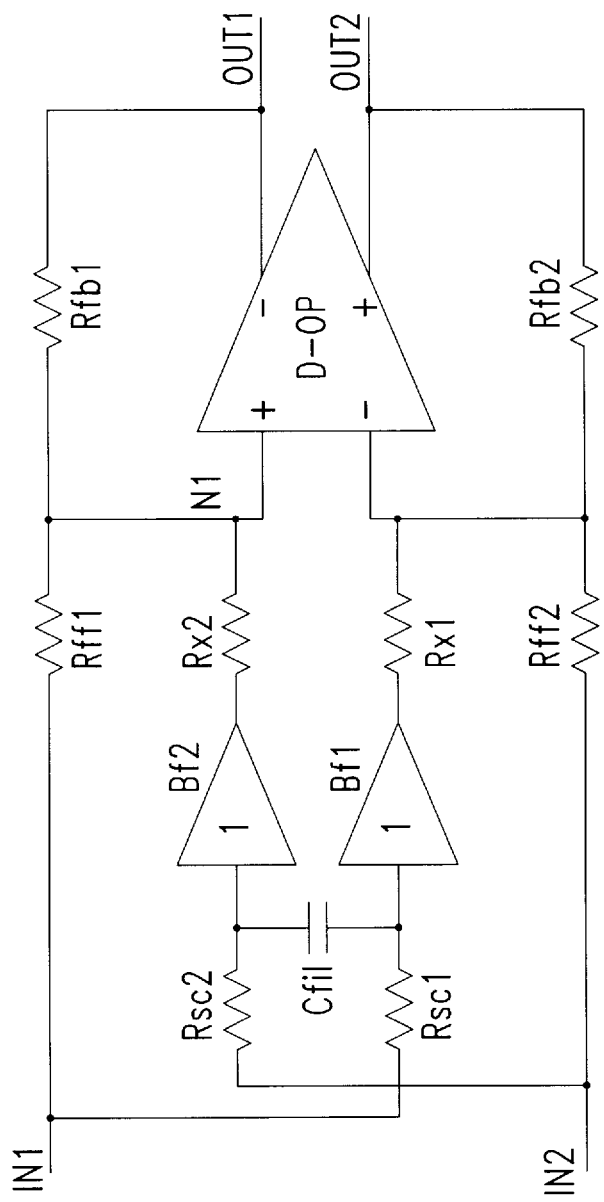
FIG. 4 is the circuit diagram of a differential version of a high-pass filter according to the invention.

FIG. 4 shows the differential version of a filter 12 according to the invention. The filter 12 includes two circuit units, each with respective first and second branches A1, A2, B1, B2 having components corresponding to those of the filter 8 of FIG. 3. Corresponding components in FIG. 4 are identified by similar names with the addition of the suffixes 1 and 2 to denote the respective branch. The adder 10 is formed by a differential operational amplifier D-OP. Unlike the filter of FIG. 3, each of the two second branches B1, B2 includes a separator Bf1, Bf2 (i.e., a buffer), instead of the inverter INV. Also, instead of each filter cell having its own capacitor connected to a reference terminal, which would also be possible, the filter cells share a common capacitor Cfil, connected between the outputs of the cells, that is, between the terminals of the resistors Rsc1 and Rsc2. The resistors Rsc1, Rsc2 form parts of the second branches B1, B2 of the first and second circuit units, respectively, and each resistor Rsc1, Rsc2 has one terminal connected to the respective separator Bf1 or Bf2. The other terminal of each of the two resistors Rsc1 and Rsc2 is connected, together with a terminal of the resistor Rff1 and Rff2 of the first branch A1, A2 of the respective unit, to the differential input terminals IN1 and IN2 of the filter 12. The output of the first branch A1 of the first unit, that is, the other terminal of the resistor Rff1 and the output of the second branch B2 of the second unit, that is, a terminal of the resistor Rx2, are joined together at a first circuit node N1, which is connected to the non-inverting terminal of the operational amplifier D-OP. The output of the first branch A2 of the second unit, that is, the other terminal of the resistor Rfl2, and the output of the second branch B1 of the first unit, that is, a terminal of the resistor Rx1, are joined together at a second circuit node N2, which is connected to the inverting terminal of the amplifier D-OP. As a result of this crossover connection, the signals which arrive at the first node N1, like those which arrive at the second node N2, always have opposite signs so that the same subtraction result is achieved as was obtained by the circuit of FIG. 3 including the inverter INV.

The differential operational amplifier D-OP has two feedback resistors Rfb1 and Rfb2, connected between its respective input and output terminals. The values of the resistors Rfb1 and Rfb2 are preferably selected so that, taking account of the input resistance values, the amplifier has a gain of 1. Clearly, however, the operation of the filter according to the invention does not change if the gain is other than 1.

Assuming $Rff_1 = Rff_2 = Rff, Rfb_1 = Rfb_2 = Rfb, Rx1 = Rx2 = Rx$, and $Rsc1 = Rsc2 = Rsc$, the transfer function of the filter is:

$$H(\omega) = \frac{Vo}{Vi} = \frac{Rfb}{Rff} \cdot \frac{1 - \frac{Rff}{Rx} + j\omega 2RscCfil}{1 + j\omega 2RscCfil} \quad (1)$$

in which Vi and Vo are the differential input and output voltages, respectively, $C_{fi1}$ is the capacitance of the capacitor $C_{fi1}$, and Rff, Rfb, Rx and Rsc are the resistances of the resistors Rff, Rfb, Rx, Rsc, respectively.

Figure 1:
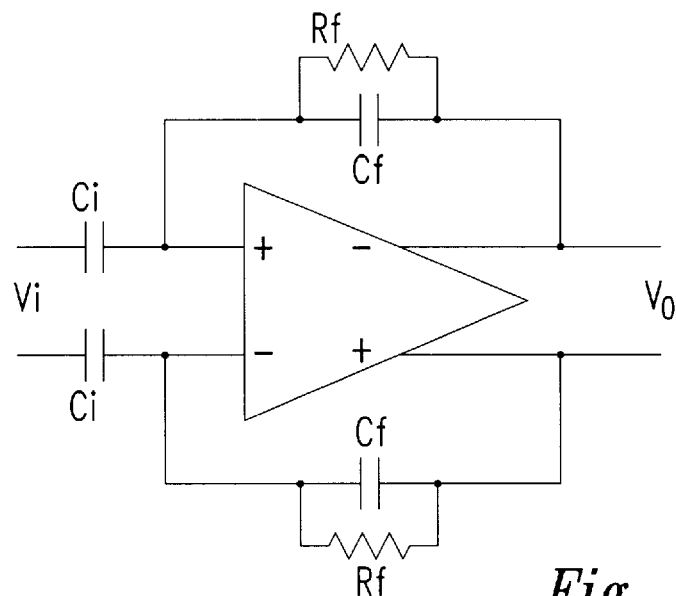
FIG. 1 is a circuit diagram of a known high-pass filter.

If Rff is equal to Rx, that is, if equal values are selected for the resistors Rff1, Rff2, Rx1 and Rx2, the transfer function becomes:

$$H(\omega) = \frac{Rfb}{Rff} \cdot \frac{j\omega 2RscCfil}{1 + j\omega 2RscCfil} = \frac{Rfb}{Rff} \cdot \frac{j\omega}{\frac{1}{2RscCfil} + j\omega} \quad (2)$$

from which it can be seen that the filter 12 has a single pole:

$$\omega p = \frac{1}{2RscCfil} \quad (3)$$

that is, it has a pole at the same frequency as the pole of the transfer function of the known filter of FIG. 1, if Rsc =Rf and Cfi1=Cf/2, and a single zero at zero frequency, like the known filter.

It should be pointed out that, if the resistances Rff and Rx are not equal, the filter 12 has a zero for a frequency other than zero, as can easily be seen by looking at equation (1). This means that a direct-current component at the input of the filter 12 is not cancelled out. In practice, however, it is possible to produce resistances Rff and Rx with a variation of less than 1%, which results in a wholly negligible deviation from the theoretical case. In a practical embodiment of a filter 12 with a canceling efficiency of 40 dB connected for canceling out the offset in a chain in which the offset of the amplifier stages upstream of the filter was about 400 mV, there was a residual offset of about 4 mV.

Another aspect to be evaluated is that of the offset introduced by the filter 12 itself. This offset is due partly to the buffers Bf1 and Bf2 and partly to the operational amplifier D-OP of the adder 10. In the practical embodiment mentioned above, in which the overall gain of the filter 12 was equal to 1 (that is, with Rx =Rff =RJb), it has been found that the total offset was 3–4 mV, that is, little greater than that introduced by the known filter of FIG. 1. The sum of the offset due to the filter 12 and of the residual offset, in terms of power, was between 5 and 6 mV, that is, not much greater than the offset of the filter 12 itself.

It can be seen from the foregoing that the total offset introduced by the filter 12 according to the invention is about twice that of the known filter 8. However, the value involved is very low and is certainly acceptable in most practical applications, in any case involving a slight worsening of the performance for which the benefits due to the saving in area when the filter 12 is formed in an integrated circuit are ample compensation. This saving is due to the fact that, with reference to the embodiment shown in FIG. 4, the filter 12 according to the invention requires a single capacitor Cfi1, as against the four capacitors Cf, Ci of the known filter shown in FIG. 1.

The advantages of the filter 12 according to the invention in comparison with the known filter of FIG. 1, can be evaluated in two ways: by considering the same value for the resistors Rf (FIG. 1) and Rsc (FIG. 4), or by assigning the same total capacitance (4Cf=Cf1) to both of the filters.

In the first case (Rf =Rsc), for the same value of the pole, and assuming unitary gain in the pass band, the known solution requires an overall capacitance eight times larger than that required by the filter according to the invention. The latter, however, requires six more resistors (Rff1, Rff2, Rx1, Rx2, Rfb1 and Rfb2), but the area required by the resistors Rff1, Rff2, Rx1, Rx2, Rfb1, Rfb2 is much less than that saved by virtue of the lower overall capacitance. It can be seen from a comparison between the two practical circuits that the area taken up by the filter 12 according to the invention was less than a quarter of that of the known filter.

In the second case (4Cf=Cfi1), for the same value of the pole, that is:

$$\omega = \frac{1}{RfCf} = \frac{1}{2RscCfil} \quad (4)$$

Rf should equal 8Rsc.

Figure 5:
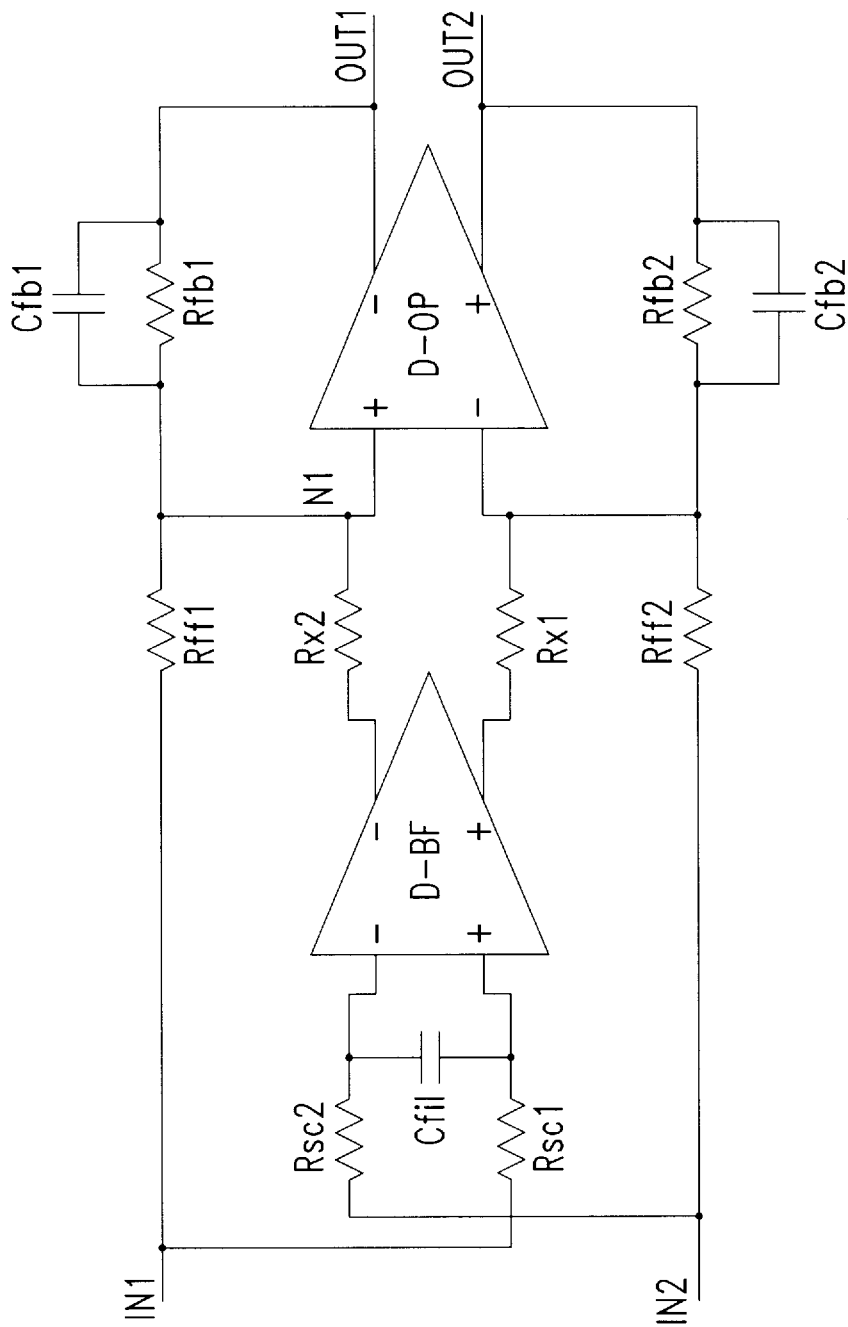
FIG. 5 is a circuit diagram of an alternative differential version of a high-pass filter according to the invention.

Both of these resistors Rf, Rsc have a high value and, in order to form them in the smallest possible area, they are formed by switched capacitor techniques. It can be shown that, to achieve the equivalent resistances necessary in the two cases by this technique, the clock frequency for the switching of the switched capacitors in the known filter is eight times lower than that necessary for the filter 12 according to the invention. This raises the problem of area again. In fact, the known filter uses a direct-current filter with a cut-off frequency eight times lower than that necessary for the filter 12 according to the invention, in order to eliminate the clock frequency. Thus results in a time constant and hence an area for the respective capacitors Cf that is eight times larger than for the inventive circuit. In this connection, it is interesting to note that with the filter 12 according to the invention, a separate filter (in practice another operational amplifier) for carrying out this function can be omitted. It suffices, however, to connect capacitors Cfb1, Cfb2 with small capacitances in parallel with each of the feedback resistors Rfb1 and Rfb2, as shown in FIG. 5. The capacitors Cfb1 Cfb2 introduce a further pole and enable the clock frequency to be filtered out. As also shown in FIG. 5, a single differential buffer circuit D-BF can be used instead of the two separate buffers Bf1 and Bf2 as a further variation in comparison with the circuit of FIG. 4.

It is important to point out that, by virtue of the smaller area required by the filter according to the invention, more than one filter can be inserted in an amplifier constituted by a chain of amplifier stages, thus achieving still a saving of area and also a smaller overall offset of the chain with clear advantages as regards the dynamics and linearity of the amplifier as a whole.

We claim:

1. A method of selectively passing frequency components of an input signal, comprising:

producing a first transferred signal proportional to the input signal by supplying the input signal to a first branch having a substantially constant gain;

producing a first low-pass signal having a cut-off frequency by supplying the input signal to a second branch having a low-pass response; and subtracting the first low-pass signal from the first transferred signal to produce a first output signal by providing the first low-pass and first transferred signals to a common terminal at the inverting input of an operational amplifier.

2. A high-pass filter, comprising:

at least one circuit unit having a first branch and a second branch connected to an input node on one side and connected to a common terminal on the other side; said first branch comprising a first series resistor; said second branch comprising in series a low-pass filter cell having one side connected to said input node, an inverter connected to an output of said low-pass filter cell, and a second series resistor connected to an output of said inverter; and an operational amplifier having a non-inverting input connected to a reference terminal, an inverting input connected to said common terminal, and an output connected to an output of the filter.

3. The high-pass filter of claim 2, wherein said first series resistor and said second series resistor have equivalent resistances.

4. A high-pass filter comprising:

two circuit units, each of said circuit units having a first branch and a second branch; each of said first branches comprising a first series resistor, and each of said second branches comprising in series a low-pass filter cell, a buffer stage, and a second series resistor; said first and second branches of said first circuit unit each having an input connected to a first input terminal, and an output of said first branch of said first circuit unit having an output connected to a first common terminal, and said second branch of said first circuit unit having an output connected to a second common terminal; said first and second branches of said second circuit unit each having an input connected to a second input terminal, and said first branch of said second circuit unit having an output connected to said second common terminal, and said second branch of said second circuit unit having an output connected to said first common terminal; an operational amplifier having a non-inverting input connected to said first common terminal and an inverting input connected to said second common terminal; a first feedback resistor connected between a first output of said operational amplifier and said first common terminal; and a second feedback resistor connected between a second output of said operational amplifier and said second common terminal.

5. The high-pass filter of claim 4, wherein each low-pass filter cell comprises a series resistor and capacitive by-pass means.

6. The high-pass filter of claim 5, wherein said capacitive by-pass means of each of said low-pass filter cells comprises a capacitor in common with said low-pass filter cells of said second branches.

7. A high-pass filter with a differential input and output, comprising:

a first circuit unit, said first circuit unit comprising a first series resistor, said first series resistor having a first end connected to an input node of the filter and a second end connected to a common terminal, a second circuit unit connected to said input node on one side and connected to said common terminal on the other side, said second circuit unit comprising in series a low-pass filter cell having an input and an output, said input of said low-pass filter cell connected to said input node; an inverter having an input and an output, said input of said inverter connected to said output of said low-pass filter cell; and a second series resistor having a first end and a second end, said first end of said second series resistor being connected to said output of said inverter and said second end of said second series resistor being connected to said common terminal; and, an operational amplifier having an noninverting input and an inverting input, said noninverting input of said operational amplifier being connected to a reference terminal, and said inverting input of s aid operational amplifier connected to said common terminal; said operational amplifier having an output connected to an output node of the filter.

8. The high-pass filter of claim 7 wherein said first and said second series resistors of said first and said second circuit units have equivalent resistances.

9. An integrated high-pass filter having differential input and output for filtering signal components in a selected frequency band, the high-pass filter comprising:

a first circuit unit having a first branch and second branch, each of said first and second branches having a first end connected to a first common input node; said first branch comprising a first series resistor having a first end and a second end, said first end of said first series resistor being connected to said first common input node and second end of said first series resistor comprising an output of said first branch, and said second branch comprising in series a low-pass filter cell, a buffer stage, and a second series resistor, said low-pass filter cell having an input and an output, said input of said low-pass filter cell being connected to said first common input node, said buffer stage having input and an output, with said input of said buffer stage being connected to said output of said low-pass filter cell, and said second series resistor having a first end and a second end, said first end of second series resistor being connected to said output of said buffer stage said second end of said second series resistor comprising an output of said second branch; said first branch of said first circuit unit having said output connected to a first common terminal, and said second branch of said first circuit unit having said output connected to a second common terminal;

a second circuit unit having first and second branches, each of said first and second branches having a first end connected to a second common input node, said first branch comprising a first series resistor having a first end and a second end, said first end of said first series resistor being connected to said second common input node and said second end of said first series resistor comprising an output of said first branch of said second circuit unit; said second branch of said second circuit unit having in series a low-pass filter cell, a buffer stage, and a second series resistor, said low-pass filter cell having an input end and output end, said input end of said low-pass filter cell connected to said second common input node, said buffer stage having an input end and an output end, said input end of said buffer stage being connected to said output end of said low-pass filter cell, and said second series resistor having a first end and second end, said first end of said second series resistor being connected to said output end of said buffer stage and second end of said second series resistor comprising an output of said second branch said first branch of said second circuit unit having said output connected to said second common terminal and said second branch of said second circuit having said output connected to said first common terminal; a differential amplifier having a non-inverting input and an inverting input, said non-inverting input connected to said first common terminal, and said inverting input connected to said second common terminal; and a first and second feedback resistor; said first feedback resistor having one end connected to a first output of said differential amplifier and a second end connected to said non-inverting input of said differential amplifier; said second feedback resistor having a first end connected to a second output of said differential amplifier and a second end connected to said inverting input of said differential amplifier.

10. The integrated high-pass filter of claim 9, wherein each low-pass filter cell comprises a series resistor and capacitive by-pass means.

11. The integrated high-pass filter of claim 10, wherein said capacitive bypass means of each of said low-pass filter cells comprises a capacitor in common with said low-pass filter cells of said second branches.

* * * * *